United States Patent
Hersam et al.

(10) Patent No.: US 12,183,574 B2
(45) Date of Patent: Dec. 31, 2024

(54) TWO-DIMENSIONAL SEMICONDUCTOR BASED PRINTABLE OPTOELECTRONIC INKS, FABRICATING METHODS AND APPLICATIONS OF SAME

(71) Applicant: NORTHWESTERN UNIVERSITY, Evanston, IL (US)

(72) Inventors: Mark C. Hersam, Wilmette, IL (US); Jung-Woo Ted Seo, Naperville, IL (US); Jian Zhu, Tianjin (CN)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 18/380,747

(22) Filed: Oct. 17, 2023

(65) Prior Publication Data
US 2024/0371635 A1 Nov. 7, 2024

Related U.S. Application Data

(63) Continuation of application No. 17/279,717, filed as application No. PCT/US2019/053362 on Sep. 27, 2019, now Pat. No. 11,830,735.
(Continued)

(51) Int. Cl.
*H01L 21/02* (2006.01)
*H01L 31/20* (2006.01)

(52) U.S. Cl.
CPC .. *H01L 21/02538* (2013.01); *H01L 21/02551* (2013.01); *H01L 21/02568* (2013.01);
(Continued)

(58) Field of Classification Search
CPC ... H01L 33/0004; H01L 31/032; H01L 31/20; H01L 31/208; H01L 21/02521;
(Continued)

(56) References Cited

U.S. PATENT DOCUMENTS 10,875,339 B1 * 12/2020 Claussen ............... G03F 7/0002
2010/0148128 A1 * 6/2010 Shah ........................ H01B 1/24
252/500

(Continued)

*Primary Examiner* — Fazli Erdem
(74) *Attorney, Agent, or Firm* — Locke Lord LLP; Tim Tingkang Xia, Esq.

(57) ABSTRACT

Printable inks based on a 2D semiconductor, such as $MoS_2$, and its applications in fully inkjet-printed optoelectronic devices are disclosed. Specifically, percolating films of $MoS_2$ nanosheets with superlative electrical conductivity ($10^{-2}$ s m$^{-1}$) are achieved by tailoring the ink formulation and curing conditions. Based on an ethyl cellulose dispersant, the $MoS_2$ nanosheet ink also offers exceptional viscosity tunability, colloidal stability, and printability on both rigid and flexible substrates. Two distinct classes of photodetectors are fabricated based on the substrate and post-print curing method. While thermal annealing of printed devices on rigid glass substrates leads to a fast photoresponse of 150 μs, photonically annealed devices on flexible polyimide substrates possess high photoresponsivity exceeding 50 mA/W. The photonically annealed photodetector also significantly reduces the curing time down to the millisecond-scale and maintains functionality over 500 bending cycles, thus providing a direct pathway to roll-to-roll manufacturing of next-generation flexible optoelectronics.

9 Claims, 13 Drawing Sheets

Related U.S. Application Data

(60) Provisional application No. 62/740,574, filed on Oct. 3, 2018.

(52) U.S. Cl.
CPC .. H01L 21/02601 (2013.01); H01L 21/02606 (2013.01); H01L 31/208 (2013.01)

(58) Field of Classification Search
CPC ......... H01L 21/02527; H01L 21/02606; H01L 21/02628
See application file for complete search history.

(56) References Cited

U.S. PATENT DOCUMENTS

2018/0010260 A1* 1/2018 Hersam .................. C09D 11/52
2019/0214634 A1* 7/2019 Arsalan .................. H01M 4/58

* cited by examiner

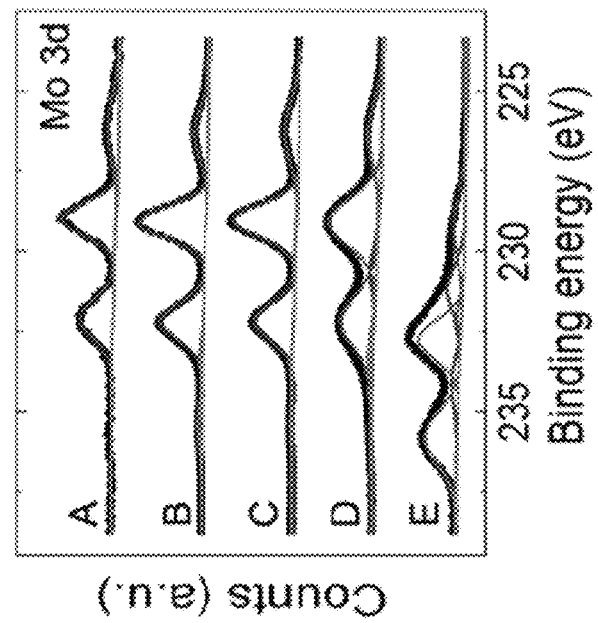
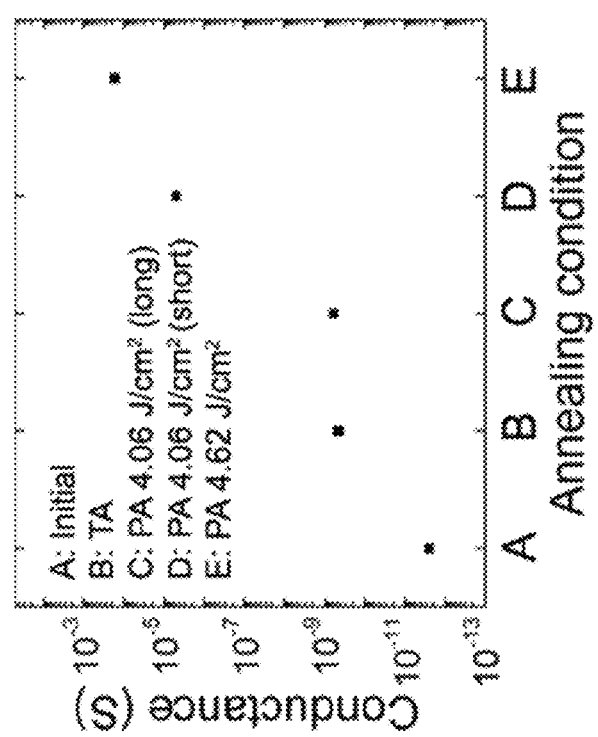
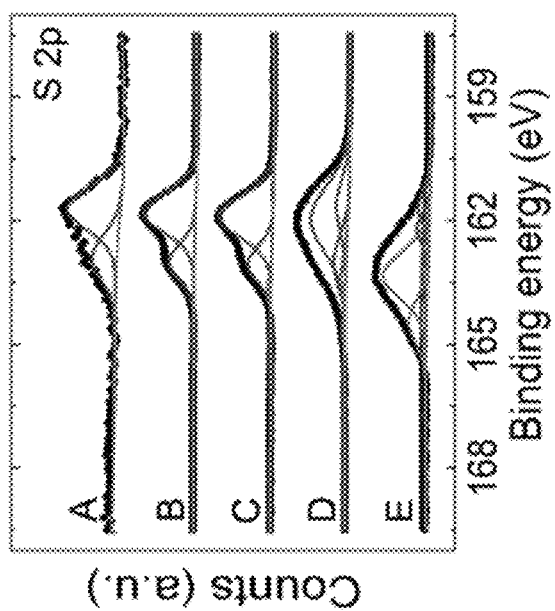
FIG. 2A
FIG. 2B
FIG. 2C

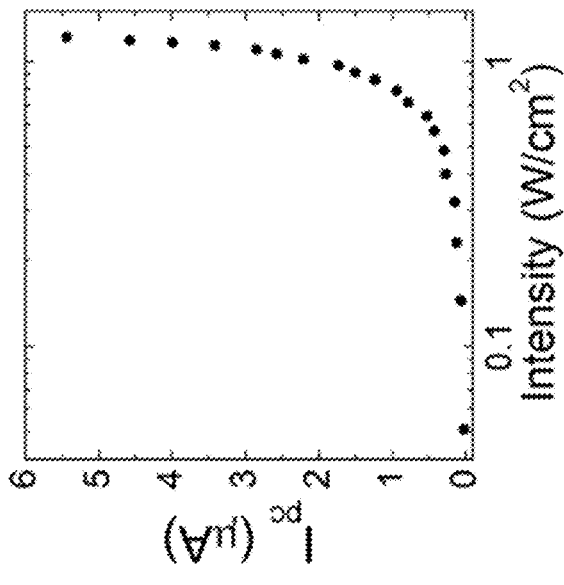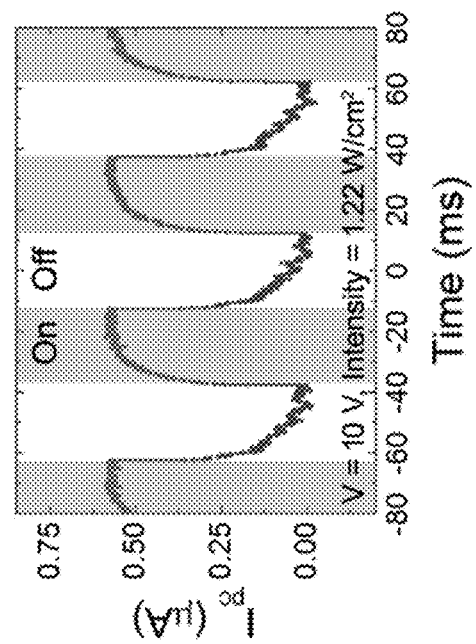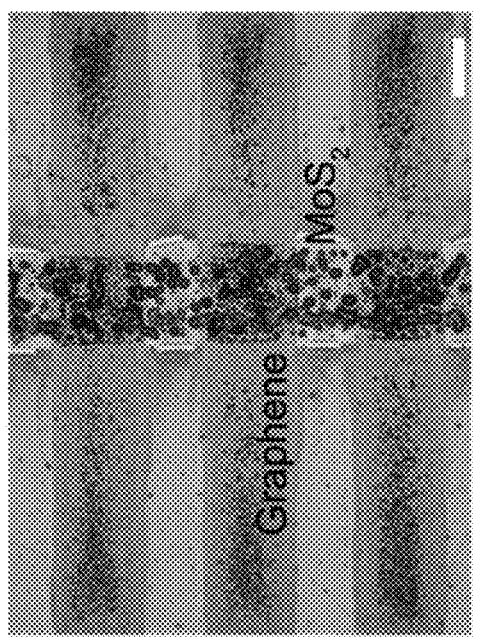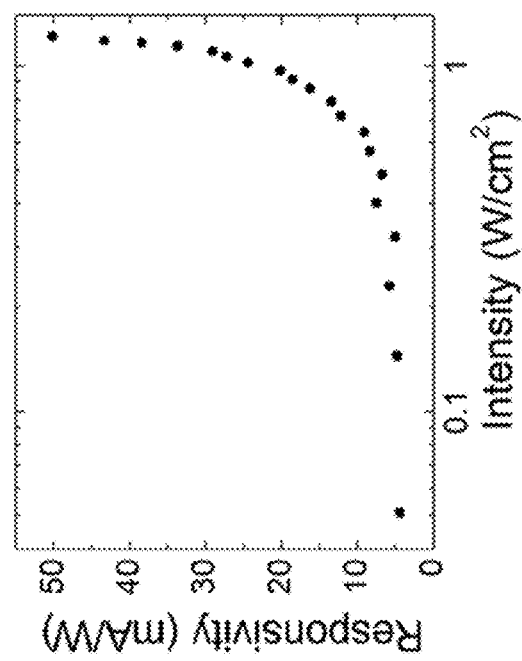

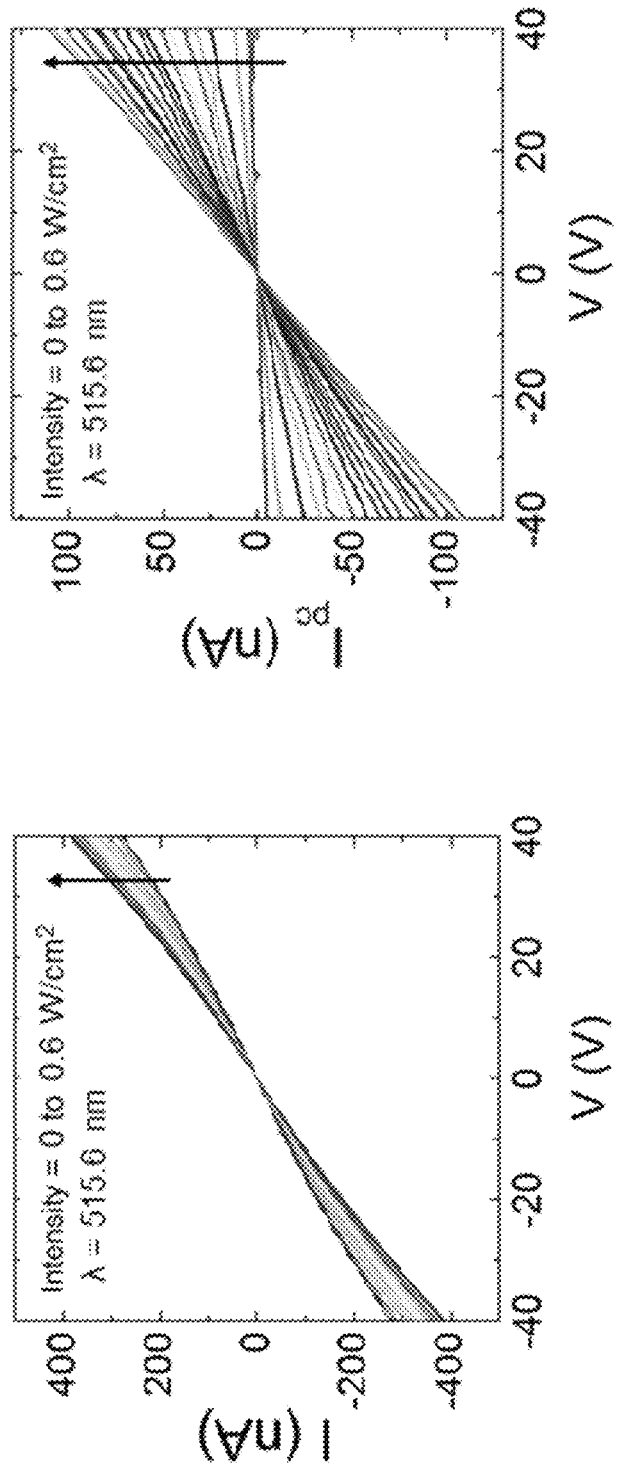
FIG. 10B
FIG. 10A
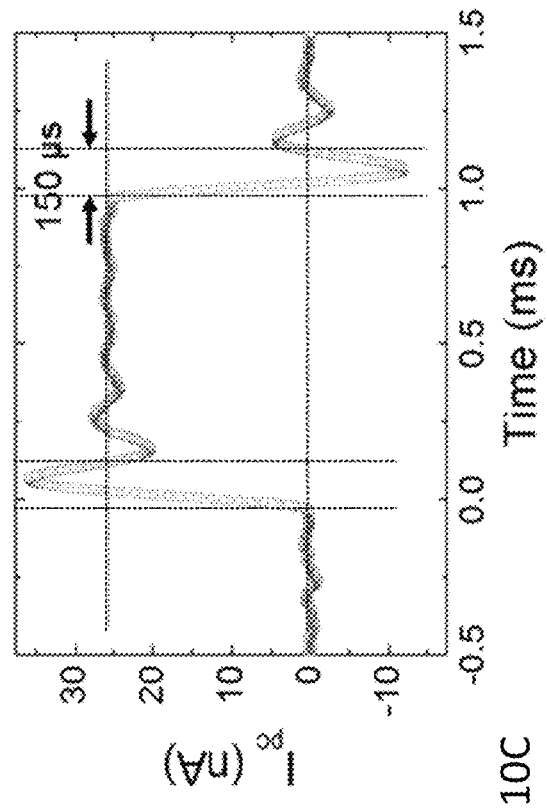
FIG. 10C

TWO-DIMENSIONAL SEMICONDUCTOR BASED PRINTABLE OPTOELECTRONIC INKS, FABRICATING METHODS AND APPLICATIONS OF SAME

CROSS-REFERENCE TO RELATED PATENT APPLICATIONS

This application is a continuation application of U.S. patent application Ser. No. 17/279,717, filed Mar. 25, 2021, now allowed, which is a U.S. national stage entry of PCT Patent Application Serial No. PCT/US2019/053362, filed Sep. 27, 2019, which itself claims priority to and the benefit of U.S. provisional patent application Ser. No. 62/740,574, filed Oct. 3, 2018, which are incorporated herein in their entireties by reference.

STATEMENT AS TO RIGHTS UNDER FEDERALLY-SPONSORED RESEARCH

This invention was made with government support under FA8650-15-2-5518 awarded by the Air Force Research Laboratory, and DMR-1720139 awarded by the National Science Foundation. The government has certain rights in the invention.

FIELD OF THE INVENTION

The present invention relates generally to semiconductors, and more particularly to printable optoelectronic inks based on two-dimensional semiconductors, fabricating methods and applications of the same.

BACKGROUND OF THE INVENTION

The background description provided herein is for the purpose of generally presenting the context of the invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the invention.

The superlative properties of ultrathin two-dimensional (2D) materials suggest their utility in a range of electronic devices. Specifically, van der Waals heterojunction devices based on 2D materials, such as semiconducting transition metal dichalcogenides (TMDCs), conductive graphene, and insulating hexagonal boron nitride, provide diverse electronic functionality. For example, high-quality TMDCs and graphene produced by micromechanical exfoliation have enabled prototype photovoltaic devices, high-performance photodetectors, light-emitting diodes, and vertical tunnel transistors. These studies highlight the compatibility between TMDCs and graphene as the active semiconductor and electrode components, respectively, which results in efficient charge carrier extraction from TMDC layers into graphene electrodes in addition to electrically tunable graphene/TMDC heterojunctions. While micromechanically exfoliated devices provide the highest quality graphene/TMDC interfaces, this fabrication approach lacks the large-area scalability required for most technologies.

Liquid-phase exfoliation from bulk layered materials provides an alternative route for the mass production of 2D nanosheets. This process involves the application of shear forces in solution, often with polymeric or ionic stabilizers that facilitate exfoliation and minimize restacking of nanosheets. Following exfoliation, additional post-processing steps such as centrifugal separation can be utilized to refine the physical attributes (e.g., thickness and size) of the resulting 2D nanosheets. By further tuning the rheological properties of the 2D nanosheet dispersions, 2D material inks have recently been reported with promising results for printed electronics. For example, thin-film transistors based on graphene electrodes, a TMDC semiconducting channel, and a hybrid boron nitride/electrolyte dielectric layer have been printed with on/off ratios of 25 and transconductances of 22 μS. In addition, vertical heterostructure photodetectors have been demonstrated by sequentially inkjet printing water-based graphene and tungsten disulfide inks, resulting in photoresponsivities on the order of 1 mA/W. Lateral heterostructures have also been explored based on printed $MoS_2$ nanosheets as the photoactive channel material with graphene or silver nanoparticles as electrodes with photoresponsivities of 36 μA/W and rise times of 60 ms. The $MoS_2$ and graphene inks in these studies were prepared by sonicating the raw powders in organic solvents (dimethylformamide or n-methyl-pyrrolidone) and centrifuging the dispersion to isolate thin nanosheets. Subsequently, multiple steps involving stabilizer addition and solvent exchange were employed to obtain suitable viscosity and surface tension for inkjet printing. While these early studies have established the feasibility of printable 2D material inks for electronic and optoelectronic applications, the device performance metrics fall well short of fundamental materials limits, suggesting the need for further innovation in 2D material ink and processing design. Furthermore, the post-printing annealing conditions in previous work have often been incompatible with flexible substrates, thus necessitating the development of alternative curing conditions in order to provide a pathway to roll-to-roll manufacturing.

Therefore, a heretofore unaddressed need exists in the art to address the aforementioned deficiencies and inadequacies.

SUMMARY OF THE INVENTION

One of the objectives of this invention is to provide alternative 2D material ink formulations and post-printing curing conditions that enable high-performance, fully inkjet-printed photodetectors on both rigid and flexible substrates. Solution-processed 2D materials offer a scalable route to meet the growing demand for multifunctional printed electronic devices.

In one aspect, the invention relates to a printable optoelectronic ink. In one embodiment, the printable optoelectronic ink includes at least one two-dimensional (2D) semiconductor, and a binder mixing with the at least one 2D semiconductor in a solvent system.

In one embodiment, the at least one 2D semiconductor comprises nanoparticles comprising nanosheets, nanoflakes, nanofibers, nanotubes, or combinations of them. In one embodiment, the at least one 2D semiconductor comprises MoS2, WS2, ReS2, InSe, GaTe, or black phosphorus (BP).

In one embodiment, the binder comprises a polymer stabilizer adapted to achieve high loading and uniform dispersion of the at least one 2D semiconductor in the solvent system. In one embodiment, the binder is adapted such that annealing of the film results in decomposition of the binder, thereby forming a percolating film in which electrical contact between the nanoparticles is enhanced. In one embodiment, the binder comprises ethyl cellulose (EC), nitrocellulose, cellulose sulfate, methyl cellulose, ethyl methyl cellulose, hydroxyethyl cellulose, hydroxypropyl cellulose, hydoxyethyl methyl cellulose, or carboxymethyl cellulose.

In one embodiment, the viscosity of the printable optoelectronic ink is tunable and optimizable by dispersing a mixture of the at least one 2D semiconductor and the binder in the solvent system at different loadings.

In one embodiment, the solvent system is a dual solvent system containing cyclohexanone and terpineol.

In one embodiment, the printable optoelectronic ink is formed such that a film is formable to have percolating networks by a single printing pass, or multiple printing passes of the printable optoelectronic ink.

In one embodiment, the printable optoelectronic ink is formed to possess a super-linear dependence of the viscosity on mass loading and reduced viscosities at elevated temperatures.

In one embodiment, the printable optoelectronic ink is applicable for inkjet printing, spray coating, screen printing, and/or blade coating.

In another aspect, the invention relates to a method of forming a printable optoelectronic ink. In one embodiment, the method includes providing a composite comprising at least one 2D semiconductor and a binder; and dispersing the composite in a solvent system.

In one embodiment, the solvent system is a dual solvent system containing cyclohexanone and terpineol.

In one embodiment, the step of providing said composite comprises dissolving the binder in a first solvent to form a first mixture, and adding at least one 2D semiconductor in the first mixture to form a second mixture; shear-mixing the second mixture, and centrifuging the shear-mixed second mixture to sediment out undesired size particles of the at least one 2D semiconductor, so as to form a supernatant containing the remaining size particles of the at least one 2D semiconductor, the binder, and the first solvent; decanting and flocculating the supernatant by mixing with an aqueous solution to form a third mixture and centrifuging the third mixture to obtain a wet composite of the at least one 2D semiconductor and the binder; and rinsing the wet composite with deionized water, collecting the rinsed composite by vacuum filtration, and drying the collected composite in air to yield powder of said composite.

In one embodiment, the step of dispersing said composite is performed with loadings of about 10-80 mg/mL using bath sonication.

In one embodiment, a content of the at least one 2D semiconductor in said composite is in a range of about 20-70 wt %.

In one embodiment, the at least one 2D semiconductor comprises nanoparticles comprising nanosheets, nanoflakes, nanofibers, nanotubes, or combinations of them. In one embodiment, the at least one 2D semiconductor comprises MoS2, WS2, ReS2, InSe, GaTe, or black phosphorus (BP).

In one embodiment, the binder comprises a polymer stabilizer adapted to achieve high loading and uniform dispersion of the at least one 2D semiconductor in the solvent system. In one embodiment, the binder is adapted such that annealing of the film results in decomposition of the binder, thereby forming a percolating film in which electrical contact between the nanoparticles is enhanced. In one embodiment, the binder comprises EC, nitrocellulose, cellulose sulfate, methyl cellulose, ethyl methyl cellulose, hydroxyethyl cellulose, hydroxypropyl cellulose, hydoxyethyl methyl cellulose, or carboxymethyl cellulose.

In one embodiment, the viscosity of the printable optoelectronic ink is tunable and optimizable by dispersing a mixture of the at least one 2D semiconductor and the binder in the solvent system at different loadings.

In one embodiment, the printable optoelectronic ink is formed such that a film is formable to have percolating networks by a single printing pass, or multiple printing passes of the printable optoelectronic ink.

In one embodiment, the printable optoelectronic ink is formed to possess a super-linear dependence of the viscosity on mass loading and reduced viscosities at elevated temperatures.

In one embodiment, the printable optoelectronic ink is applicable for inkjet printing, spray coating, screen printing, and/or blade coating.

In yet another aspect, the invention relates to an optoelectronic device comprising at least one element formed of the printable optoelectronic ink disclosed above on a substrate.

In one embodiment, the optoelectronic device further comprises electrodes coupled with the at least one element. In one embodiment, the electrodes are formed of a printable graphene ink.

In one embodiment, the substrate comprises a rigid substrate or a flexible substrate.

In one embodiment, the at least one element is thermally annealed or photonically annealed.

In one embodiment, the optoelectronic device is characterizable with a power-law fitting of $Y=a*X^b$, wherein Y is a photocurrent and X is a laser intensity, wherein $a=1.93*10^{-7}$ and $b=1.13$, when the at least one element is thermally annealed; or $a=4.52*10^{-5}$ and $b=4.35$, when the at least one element is photonically annealed.

In one embodiment, the optoelectronic device is characterizable with a fast photoresponse of about 150 us or shorter when thermal annealed, or high photoresponsivity exceeding about 50 mA/W when photonically annealed.

In one embodiment, the optoelectronic device is a photodetector, a photosensor, a photodiode, a solar cell, a phototransistor, a light-emitting diode, a laser diode, integrated optical circuit (IOC) elements, a photoresistor, a charge-coupled imaging device, or combinations of them.

In a further aspect, the invention relates to a method of forming an optoelectronic device. In one embodiment, the method includes printing a percolating film on a substrate with the printable optoelectronic ink disclosed above; and annealing the percolating film to decompose the binder and enhance electrical contact between nanoparticles of the at least one 2D semiconductor in the percolating film.

In one embodiment, the printing step is performed with inkjet printing, spray coating, screen printing, and/or blade coating.

In one embodiment, the annealing step is performed with thermal annealing or photonic annealing.

In one embodiment, the annealing step is performed under annealing conditions configured to minimize oxidation of the at least one 2D semiconductor.

In one embodiment, the method further comprises forming electrodes with a printable graphene ink, wherein the electrodes are coupled with the percolating film.

Certain exemplary embodiments of the invention demonstrate fully inkjet-printed photodetectors based on molybdenum disulfide ($MoS_2$) nanosheets as the active channel material and graphene as the electrodes. Percolating films of $MoS_2$ nanosheets with superlative electrical conductivity ($10^{-2}$ S m$^{-1}$) are achieved by tailoring the ink formulation and curing conditions. Based on an ethyl cellulose dispersant, the $MoS_2$ nanosheet ink also offers exceptional viscosity tunability, colloidal stability, and printability on both rigid and flexible substrates. In certain embodiments, two distinct classes of photodetectors are fabricated based on the substrate and post-print curing method. While thermal annealing of printed devices on rigid glass substrates leads to a fast photoresponse of about 150 μs, photonically annealed devices on flexible polyimide substrates possess high photoresponsivity exceeding about 50 mA/W. The photonically annealed photodetector also significantly reduces the curing time down to the millisecond-scale and maintains functionality over about 500 bending cycles, thus providing a direct pathway to roll-to-roll manufacturing of next-generation flexible optoelectronics.

These and other aspects of the present invention will become apparent from the following description of the preferred embodiment taken in conjunction with the following drawings, although variations and modifications therein may be affected without departing from the spirit and scope of the novel concepts of the invention.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 1A: Photograph of the $MoS_2$/EC ink (inset) and its viscosity dependence on solid loading and temperature. FIG. 1B: Inkjet-printed $MoS_2$/EC lines on glass (top) and polyimide (bottom). The width of the printed lines can be tuned with the number of rows of droplets per line, as indicated by the red circles. The scale bar is 100 μm. FIG. 1C: Average height measured by profilometry from the as-printed (initial), thermally annealed (TA), and photonically annealed (PA) $MoS_2$/EC lines. Inset: Height profiles from the initial (101, black), TA (102, red), and PA (103, blue) lines after 7 printing passes. FIG. 1D: SEM images of inkjet-printed $MoS_2$/EC films following TA and PA, respectively. The scale bars are 1 μm.

FIGS. 2A-2C show electrical and chemical characterization of inkjet-printed $MoS_2$/EC films following different annealing conditions according to embodiments of the invention. FIG. 2A: Electrical conductance measured from inkjet-printed $MoS_2$/EC lines following different annealing conditions. The as-printed lines were about 165 μm wide and about 700 nm thick, and the electrical conductance was measured with two probes spaced by 300 μm. A: no annealing (initial); B: TA at about 400° C. for about 3 hr under Ar/$H_2$; C: PA at about 2.8 kV for about 1.36 ms (about 4.06 J/cm$^2$ with long pulse duration); D: PA at about 3 kV for about 1.16 ms (4.06 J/cm$^2$ with short pulse duration); E: PA at about 3 kV for about 1.32 ms (about 4.62 J/cm$^2$). FIGS. 2B-2C: XPS analysis of the Mo 3d and S 2p spectral regions, respectively, for the inkjet-printed $MoS_2$/EC films under the same annealing conditions as FIG. 2A. The red curves indicate the pristine $MoS_2$ peaks, whereas the other colors represent oxidized states of $MoO_x$.

FIG. 3A: Photograph (left) of the inkjet-printed photodetector on glass, and optical microscopy image (right) of the $MoS_2$/EC channel (vertical line) and graphene/EC electrodes (horizontal lines) after annealing. The scale bars are 3 mm for the photograph and 100 μm for the optical microscopy image. FIG. 3B: Current-voltage curves of a $MoS_2$-Gr TA photodetector showing the dark and illuminated ($\lambda$=515.6 nm, laser intensity=0.6 W/cm$^2$) currents, and the corresponding photocurrent. FIG. 3C: Photocurrent and responsivity as a function of intensity at a bias voltage of about 40 V. FIG. 3D: Temporal response showing current modulation as the laser is switched on and off.

FIGS. 4A-4F show fully printed $MoS_2$-Gr photodetectors prepared with photonic annealing according to embodiments of the invention. FIG. 4A: Optical microscopy image of the inkjet-printed photodetector on polyimide (PI) after photonic annealing, with a vertical $MoS_2$/EC channel and horizontal graphene/EC electrodes. The scale bar is 100 μm. FIGS. 4B-4C: Photocurrent and responsivity as a function of laser intensity at a bias voltage of 40 V. FIG. 4D: Temporal response showing current modulation as the laser is switched on and off. FIG. 4E: Bending test over about 500 cycles showing invariant sensitivity. Inset: photograph of the flexible $MoS_2$-Gr device. The scale bar is 3 mm. FIG. 4F: Comparison of photodetector characteristics from $MoS_2$-Gr TA on glass (red), $MoS_2$-Gr PA on PI (blue), and literature precedent for $MoS_2$—Ag thermally annealed on $SiO_2$/Si.

FIGS. 10A-10C show additional photocurrent data from the $MoS_2$-Gr TA device according to embodiments of the invention. FIG. 10A: I-V, FIG. 10B: $I_{pc}$-V, and FIG. 10C: $I_{pc}$-t plots for different irradiation intensities.

FIG. 11A: I-V and FIG. 11B: $I_{pc}$-V plots for different irradiation intensities, respectively.

DETAILED DESCRIPTION OF THE INVENTION

Figure 1A:
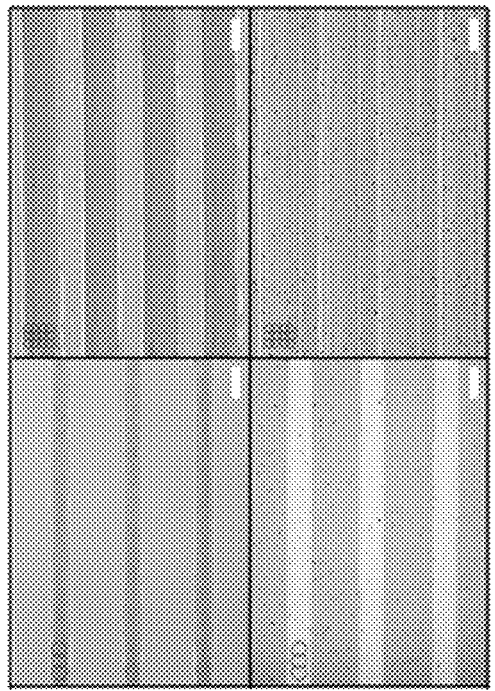
FIGS. 1A-1D show inkjet printing characteristics of $MoS_2$/EC inks according to embodiments of the invention.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this specification will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures. is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures. is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having", or "carry" and/or "carrying," or "contain" and/or "containing," or "involve" and/or "involving, and the like are to be open-ended, i.e., to mean including but not limited to. When used in this specification, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

As used in this specification, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated.

As used in this specification, the phrase "at least one of A, B, and C" should be construed to mean a logical (A or B or C), using a non-exclusive logical OR. As used herein, the term "and/or" includes any and all combinations of one or more of the associated listed items.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

One of the objectives of this invention is to provide alternative 2D material ink formulations and post-printing curing conditions that enable high-performance, fully inkjet-printed photodetectors on both rigid and flexible substrates. Solution-processed 2D materials offer a scalable route to meet the growing demand for multifunctional printed electronic devices.

One aspect of the invention discloses a printable optoelectronic ink including at least one two-dimensional (2D) semiconductor, and a binder mixing with the at least one 2D semiconductor in a solvent system. In one embodiment, the solvent system is a dual solvent system containing cyclohexanone and terpineol.

In one embodiment, the at least one 2D semiconductor comprises nanoparticles comprising nanosheets, nanoflakes, nanofibers, nanotubes, or combinations of them. In one embodiment, the at least one 2D semiconductor comprises MoS2, WS2, ReS2, InSe, GaTe, or black phosphorus (BP).

In one embodiment, the binder comprises a polymer stabilizer adapted to achieve high loading and uniform dispersion of the at least one 2D semiconductor in the solvent system. In one embodiment, the binder is adapted such that annealing of the film results in decomposition of the binder, thereby forming a percolating film in which electrical contact between the nanoparticles is enhanced. In one embodiment, the binder comprises ethyl cellulose (EC), nitrocellulose, cellulose sulfate, methyl cellulose, ethyl methyl cellulose, hydroxyethyl cellulose, hydroxypropyl cellulose, hydoxyethyl methyl cellulose, or carboxymethyl cellulose.

In one embodiment, the viscosity of the printable optoelectronic ink is tunable and optimizable by dispersing a mixture of the at least one 2D semiconductor and the binder in the solvent system at different loadings.

In one embodiment, the printable optoelectronic ink is formed such that a film is formable to have percolating networks by a single printing pass, or multiple printing passes of the printable optoelectronic ink.

In one embodiment, the printable optoelectronic ink is formed to possess a super-linear dependence of the viscosity on mass loading and reduced viscosities at elevated temperatures.

In one embodiment, the printable optoelectronic ink is applicable for inkjet printing, spray coating, screen printing, and/or blade coating.

Another aspect of the invention discloses a method of forming a printable optoelectronic ink, which includes providing a composite comprising at least one 2D semiconductor and a binder; and dispersing the composite in a solvent system. In one embodiment, the solvent system is a dual solvent system containing cyclohexanone and terpineol.

In one embodiment, the step of providing said composite comprises dissolving the binder in a first solvent to form a first mixture, and adding at least one 2D semiconductor in the first mixture to form a second mixture; shear-mixing the second mixture, and centrifuging the shear-mixed second mixture to sediment out undesired size particles of the at least one 2D semiconductor, so as to form a supernatant containing the remaining size particles of the at least one 2D semiconductor, the binder, and the first solvent; decanting and flocculating the supernatant by mixing with an aqueous solution to form a third mixture and centrifuging the third mixture to obtain a wet composite of the at least one 2D semiconductor and the binder; and rinsing the wet composite with deionized water, collecting the rinsed composite by vacuum filtration, and drying the collected composite in air to yield powder of said composite.

In one embodiment, the step of dispersing said composite is performed with loadings of about 10-80 mg/mL using bath sonication.

In one embodiment, a content of the at least one 2D semiconductor in said composite is in a range of about 20-70 wt %.

In one embodiment, the at least one 2D semiconductor comprises nanoparticles comprising nanosheets, nanoflakes, nanofibers, nanotubes, or combinations of them. In one embodiment, the at least one 2D semiconductor comprises MoS2, WS2, ReS2, InSe, GaTe, or black phosphorus (BP).

In one embodiment, the binder comprises a polymer stabilizer adapted to achieve high loading and uniform dispersion of the at least one 2D semiconductor in the solvent system. In one embodiment, the binder is adapted such that annealing of the film results in decomposition of the binder, thereby forming a percolating film in which electrical contact between the nanoparticles is enhanced. In one embodiment, the binder comprises EC, nitrocellulose, cellulose sulfate, methyl cellulose, ethyl methyl cellulose, hydroxyethyl cellulose, hydroxypropyl cellulose, hydoxyethyl methyl cellulose, or carboxymethyl cellulose.

In one embodiment, the viscosity of the printable optoelectronic ink is tunable and optimizable by dispersing a mixture of the at least one 2D semiconductor and the binder in the solvent system at different loadings.

In one embodiment, the printable optoelectronic ink is formed such that a film is formable to have percolating networks by a single printing pass, or multiple printing passes of the printable optoelectronic ink.

In one embodiment, the printable optoelectronic ink is formed to possess a super-linear dependence of the viscosity on mass loading and reduced viscosities at elevated temperatures.

In one embodiment, the printable optoelectronic ink is applicable for inkjet printing, spray coating, screen printing, and/or blade coating.

Yet another aspect of the invention discloses an optoelectronic device comprising at least one element formed of the printable optoelectronic ink disclosed above on a substrate.

In one embodiment, the optoelectronic device further comprises electrodes coupled with the at least one element. In one embodiment, the electrodes are formed of a printable graphene ink.

In one embodiment, the substrate comprises a rigid substrate or a flexible substrate.

In one embodiment, the at least one element is thermally annealed or photonically annealed.

In one embodiment, the optoelectronic device is characterizable with a power-law fitting of $Y=a*X^b$, wherein Y is a photocurrent and X is a laser intensity, wherein $a=1.93*10^{-7}$ and $b=1.13$, when the at least one element is thermally annealed; or $a=4.52*10^{-5}$ and $b=4.35$, when the at least one element is photonically annealed.

In one embodiment, the optoelectronic device is characterizable with a fast photoresponse of about 150 μs or shorter when thermal annealed, or high photoresponsivity exceeding about 50 mA/W when photonically annealed.

In one embodiment, the optoelectronic device is a photodetector, a photosensor, a photodiode, a solar cell, a phototransistor, a light-emitting diode, a laser diode, integrated optical circuit (IOC) elements, a photoresistor, a charge-coupled imaging device, or combinations of them.

A further aspect of the invention disclose a method of forming an optoelectronic device, which includes printing a percolating film on a substrate with the printable optoelectronic ink disclosed above; and annealing the percolating film to decompose the binder and enhance electrical contact between nanoparticles of the at least one 2D semiconductor in the percolating film.

In one embodiment, the printing step is performed with inkjet printing, spray coating, screen printing, and/or blade coating.

In one embodiment, the annealing step is performed with thermal annealing or photonic annealing.

In one embodiment, the annealing step is performed under annealing conditions configured to minimize oxidation of the at least one 2D semiconductor.

In one embodiment, the method further comprises forming electrodes with a printable graphene ink, wherein the electrodes are coupled with the percolating film.

Figure 5:
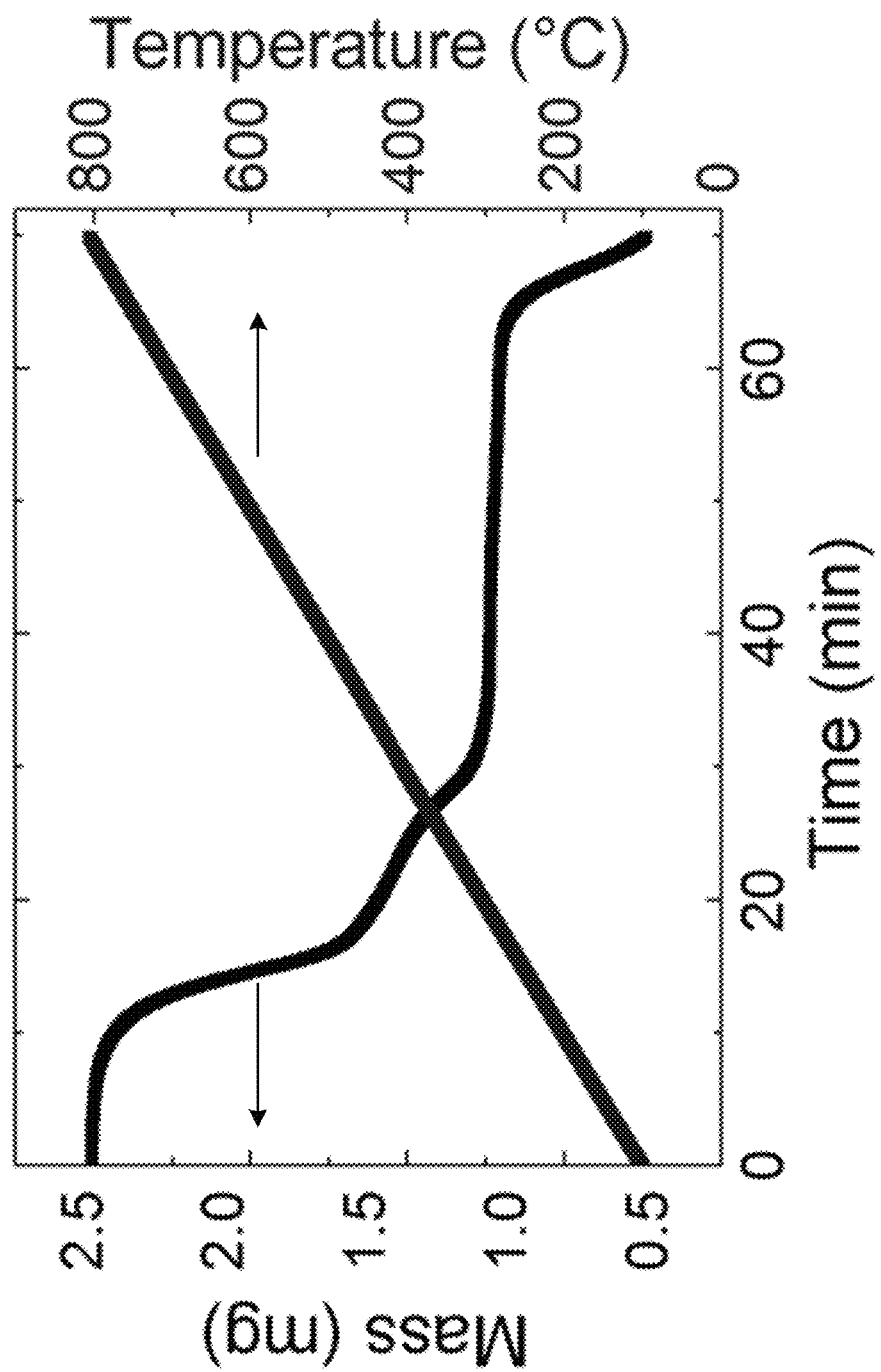
FIG. 5 shows thermogravimetric analysis of $MoS_2$/EC powders in air according to embodiments of the invention. The first slope indicates the onset of EC decomposition, followed by removal of less-volatile carbonaceous residues, oxidization of $MoS_2$, and $MoS_2$ decomposition.

To further illustrate the principles of the invention and their practical application, certain exemplary embodiments of the invention are described below with reference to the accompanying drawings. Specifically, 2D material ink formulations and post-printing curing conditions that enable high-performance, fully inkjet-printed MoS$_2$-graphene photodetectors on both rigid and flexible substrates are provided. The MoS$_2$ ink utilizes the polymer stabilizer EC that has been shown to provide several advantages for inkjet-printed graphene. In particular, EC allows efficient exfoliation of pristine MoS$_2$ powders in ethanol, leading to gram-scale production of nanosheets via shear mixing, centrifugation for size-selection (thickness <6 nm, lateral size <100 nm), and reversible flocculation by mixing with aqueous NaCl solution. While the MoS$_2$:EC ratio is tunable by varying the initial loading of EC for shear mixing, relatively high content of MoS$_2$ in the flocculated powder was utilized here to facilitate subsequent processing steps, with the MoS$_2$ content fraction (about 44 wt %) being confirmed with thermal gravimetric analysis, as shown in FIG. 5.

Figure 1B:
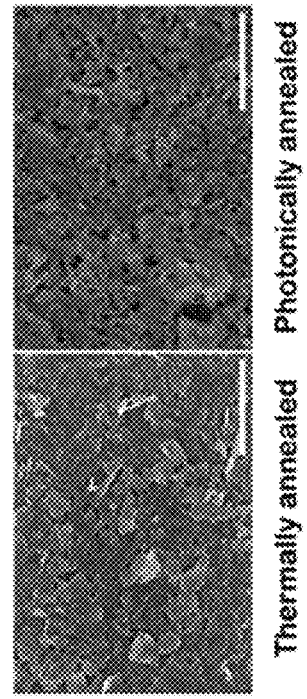
Figure 1C:
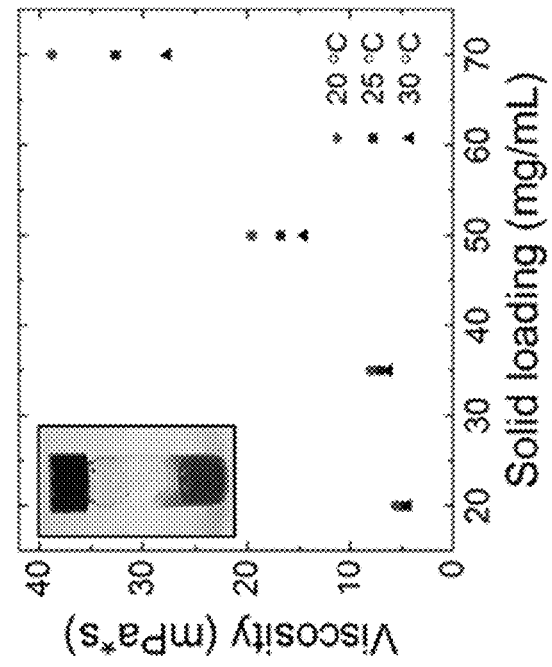
Figure 1D:
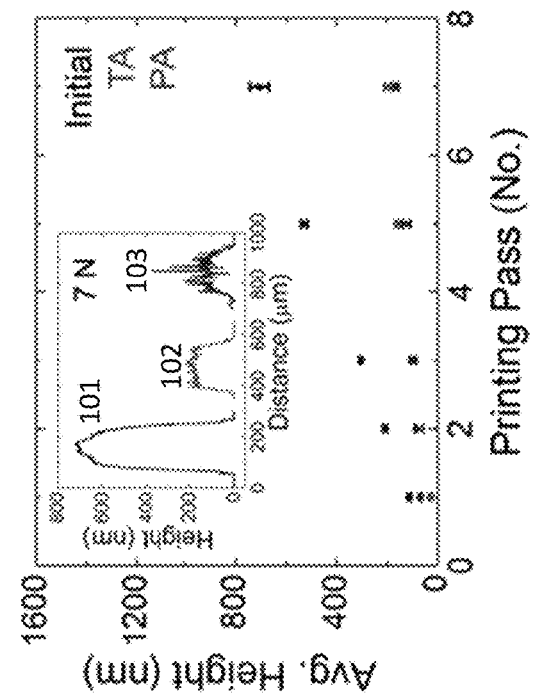
Figure 6B:
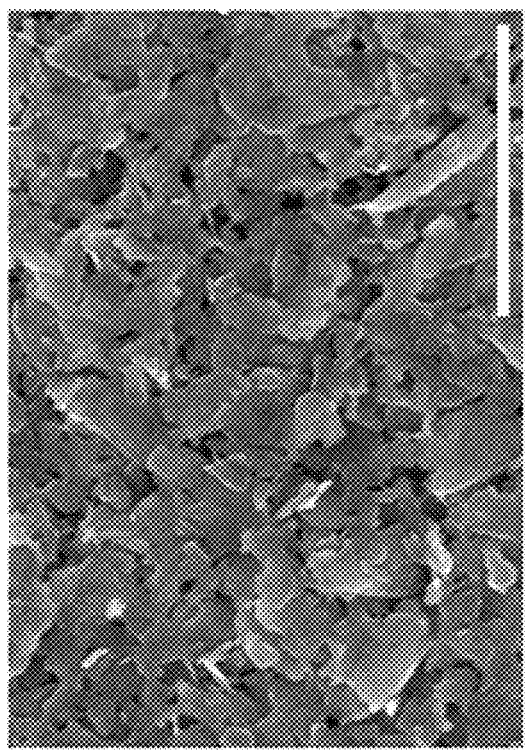
FIGS. 6A-6B show SEM images of the inkjet-printed $MoS_2$/EC ink after 1 printing pass and 5 printing passes, respectively, according to embodiments of the invention. The scale bars are 1 μm.
Figure 6A:
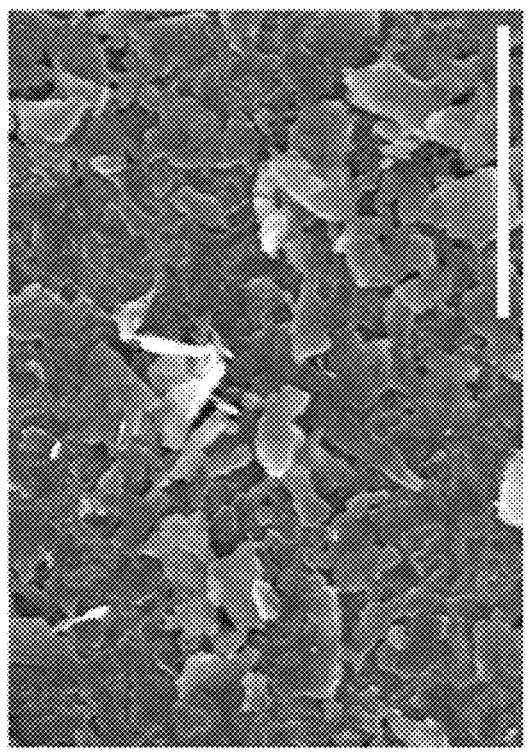

To optimize the ink viscosity for inkjet printing, the dried MoS$_2$/EC powder was dispersed in a dual solvent system of about 85:15 v/v cyclohexanone/terpineol at different loadings, as shown FIG. 1A. The MoS$_2$/EC ink possesses a super-linear dependence of viscosity on mass loading and reduced viscosities at elevated temperatures, which follows established rheological models for polymer dispersions in organic solvents. While inkjet printing is the focus here, the viscosity tunability for the MoS$_2$/EC system suggests additional ink formulations for other printing and film formation methods such as screen printing and blade coating. Considering the ideal viscosity range of about 8-15 mPa·s for inkjet printing of nanomaterials, a total MoS$_2$/EC loading of about 35 mg/mL was used for inkjet printing experiments. The characteristics of representative inkjet-printed MoS$_2$/EC lines are shown in FIGS. 1B-1D. Notably, the feature resolution on both rigid (e.g., glass) and flexible (e.g., polyimide) substrates is controllable by configuring the droplet formation as one of the inkjet printing conditions. The printed lines on polyimide (PI) exhibited slightly greater spreading in general, as expected from its higher surface roughness and lower surface energy. The thickness of inkjet-printed MoS$_2$/EC layers scaled linearly with the number of printing passes with a thickness of about 100 nm for each layer. In contrast to previous reports of inkjet-printed MoS$_2$ films, the ink formulation leads to percolating networks after only a single printing pass, as shown by scanning electron microscopy (SEM) images of films after annealing, as shown in FIGS. 6A-6B, which is attributed to the role of EC in achieving high loading and uniform dispersion of MoS$_2$ nanosheets.

Figure 7B:
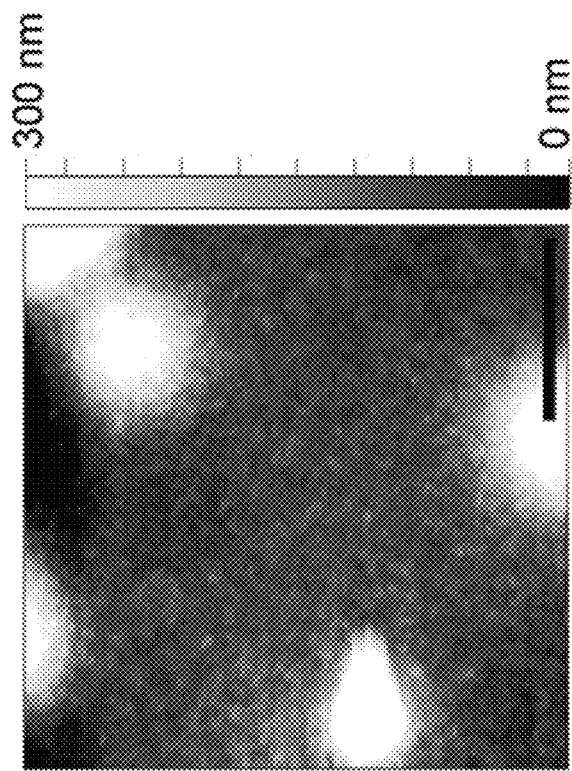
FIGS. 7A-7B show AFM images of an $MoS_2$ TA film and an $MoS_2$ PA film, respectively, according to embodiments of the invention. The scale bars are 10 μm.
Figure 7A:
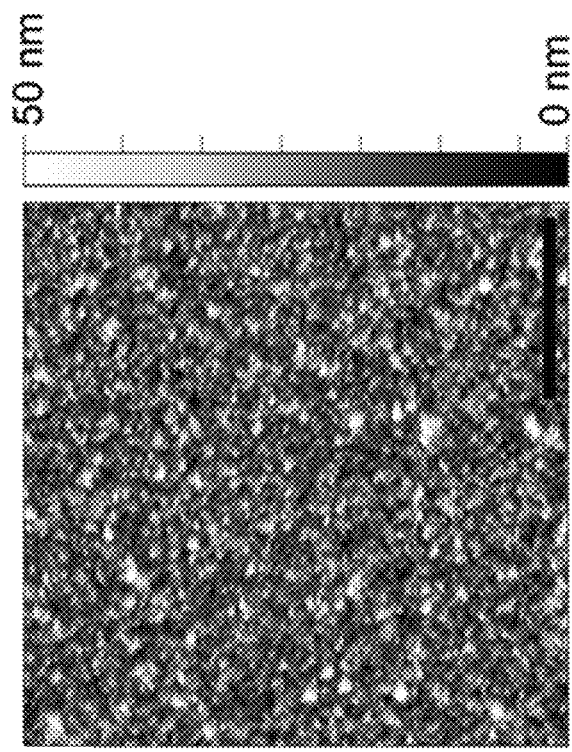

Following printing, annealing is required to decompose the EC and enhance electrical contact between the nanosheets in the percolating film. For EC-based graphene films, both thermal and photonic annealing have proven to be effective at yielding high electrical conductivity. The inkjet-printed MoS$_2$ films were similarly subjected to the following conditions: (1) thermal annealing (TA) at about 400° C. in Ar/H$_2$ environment for about 3 hours, and (2) photonic annealing (PA) at about 2.8 kV for about 1.36 ms in air. The TA conditions were carefully selected to minimize oxidation of MoS$_2$, which becomes highly evident above 250° C. in air. As an alternative to the traditional TA approach, photothermal PA treatments have recently emerged as a highly efficient method for desorbing residual solvent and decomposing polymeric binders from graphene-based composite films. This method employs a high-intensity pulsed light source to rapidly heat the active, light-absorbing material with minimal thermal load on the underlying substrate. Due to its compatibility with a wide selection of substrates and extremely short treatment times, PA is a promising curing method for roll-to-roll processing of optically absorbing nanomaterial inks on flexible substrates. One frequent morphological characteristic of photonically annealed films is their increased porosity, which is attributed to the rapid gas-phase evolution of adsorbed solvent residues and binder decomposition products. This morphological behavior is similarly observed in MoS$_2$/EC films as the height profile and SEM image of photonically annealed films indicate higher roughness compared to thermally annealed films (root-mean-square roughnesses extracted from atomic force microscopy (AFM) images of PA and TA MoS$_2$/EC films were 255±34 nm and 48±2 nm, respectively; FIGS. 7A-7B).

FIGS. 2A-2C show electrical and chemical characterization of inkjet-printed MoS$_2$/EC films following different TA and PA treatments. Careful tailoring of the annealing conditions is necessary to minimize oxidation of MoS$_2$ nanosheets since oxidation leads to disordered structures, increases undesired metallic characteristics, and ultimately results in decreased photoexcitation in photodetectors. The oxidation of MoS$_2$ nanosheets under different annealing conditions was initially probed using charge transport measurements, as shown in FIG. 2A. For TA in Ar/H$_2$ environments and mild PA conditions in air, the film conductance is enhanced by approximately two orders of magnitude and is attributed to the effective removal of EC with minimal MoS$_2$ oxidation. In contrast, for more aggressive PA conditions in air, the conductance dramatically increases by more than six orders of magnitude, which suggests significant oxidation of MoS$_2$. Previously, the products of MoS$_2$ oxidation, namely MoO$_3$ and MoO$_2$, have been shown to possess comparably higher conductivity than MoS$_2$ due to their degenerately doped semiconducting and metallic properties, respectively.

To chemically probe the oxidation of MoS$_2$ following different annealing conditions, X-ray photoelectron spectroscopy (XPS) was performed. FIGS. 2B and 2C show the Mo 3d and S 2p spectra for MoS$_2$/EC films as a function of annealing condition. For TA in Ar/H$_2$ environments and mild PA conditions in air, no measurable changes are observed for the Mo$^{4+}$ and S$^{2-}$ XPS peaks, thereby confirming the preservation of the integrity of the semiconducting MoS$_2$ phase (Mo 3d$_{5/2}$=229 eV, Mo 3d$_{3/2}$=232 eV; S 2p$_{3/2}$=161.9 eV, S 2pv$_{1/2}$=163 eV). The total amount of dissipated energy in PA can be controlled via the input voltage and duration of the light pulse. The optimized PA condition that minimizes MoS$_2$ oxidation and achieves a similar electrical conductivity as the TA treatment involves a single light pulse with input voltage of about 2.8 kV for about 1.36 ms (equivalent to an energy of about 4.06 J/cm$^2$). One noteworthy observation is that the degree of oxidation depends on the duration over which the entire amount of energy is applied, which is also likely applicable to other 2D materials prone to oxidation. For example, when a printed MoS$_2$/EC film was photonically annealed with the same nominal energy of about 4.06 J/cm$^2$ but with higher input voltage and shorter pulse duration (i.e., about 3 kV for about 1.16 ms), the measured conductance showed an increase of over 6 orders of magnitude, and the XPS revealed the emergence of peaks associated with MoO$_x$. This effect is more evident at a higher energy of about 4.62 J/cm$^2$ (i.e., about 3 kV for about 1.32 ms), which leads to a highly disordered mixture of phases with dominant composition of the oxidized species. Ultimately, these results indicate that PA is as effective as TA in removing the EC binders from inkjet-printed MoS$_2$/EC films, albeit with more intricate process optimization than graphene-based systems due to the higher propensity for MoS$_2$ oxidation.

Figure 3A:
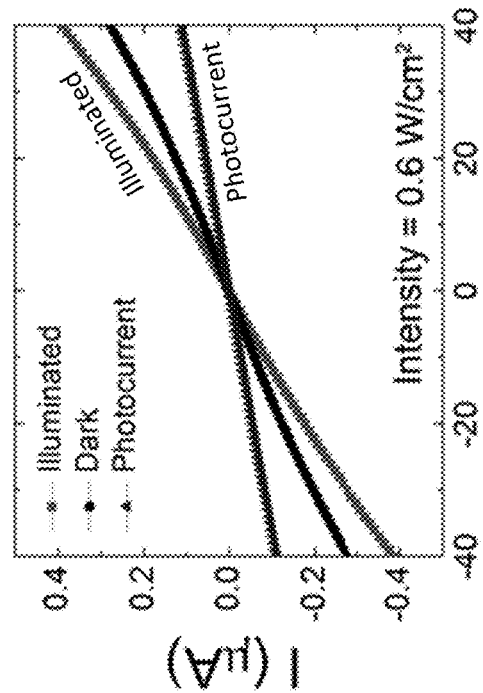
FIGS. 3A-3D show fully printed $MoS_2$-Gr photodetectors prepared with thermal annealing according to embodiments of the invention.
Figure 8:
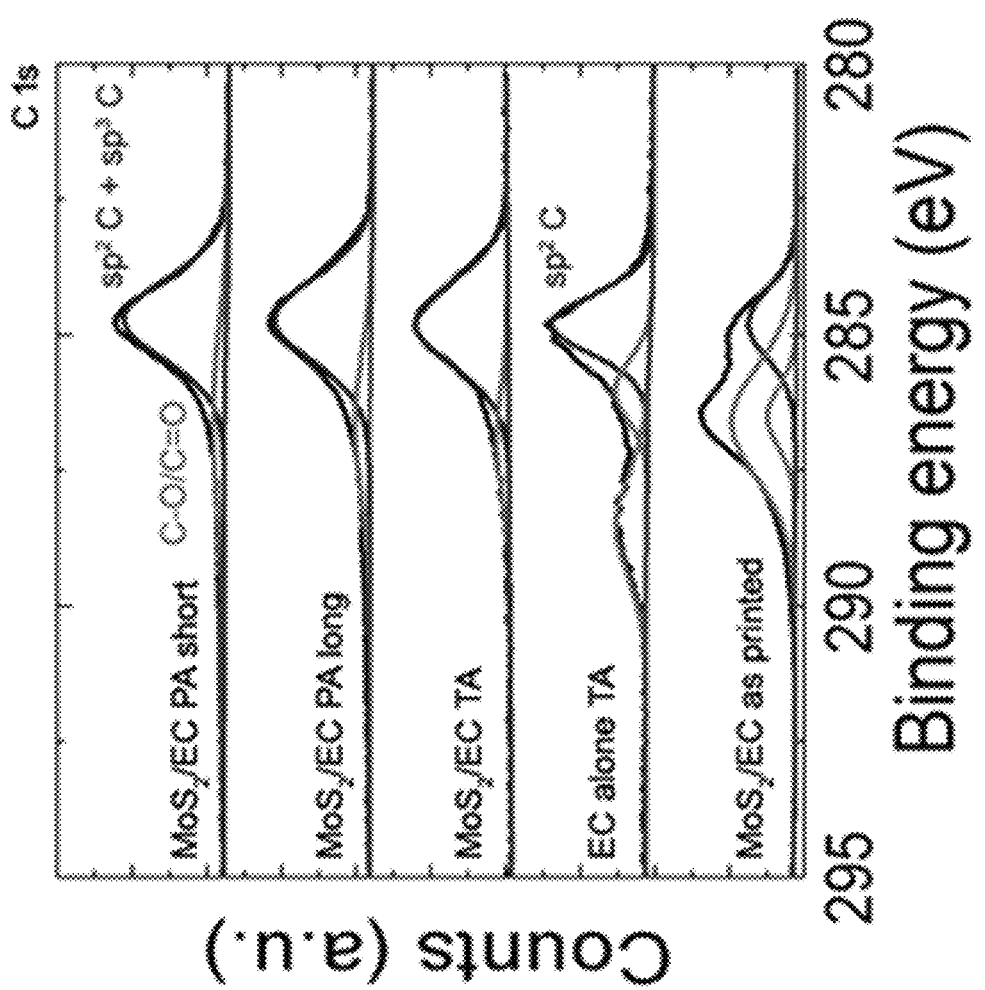
FIG. 8 shows XPS analysis of EC decomposition with $MoS_2$, indicating the presence of carbonaceous residues according to embodiments of the invention.

To demonstrate the functionality of inkjet-printed MoS$_2$/EC, we fabricated two types of fully printed photodetectors utilizing graphene (Gr) as the electrode material on rigid glass substrates with thermal annealing (MoS$_2$-Gr TA) and flexible polyimide substrates with photonic annealing (MoS$_2$-Gr PA). FIG. 3A shows the configuration of the MoS$_2$-Gr TA device on glass, in which MoS$_2$/EC layers were first inkjet-printed and thermally annealed, followed by inkjet printing of graphene/EC layers on top and finally thermally annealing the entire device at the aforementioned optimized TA condition. The charge transport results in FIG. 3B reveal a high dark bulk conductivity of about $2.73\times10^{-3}$ S/m and photocurrent over about 100 nA at an irradiation intensity of about 0.6 W/cm$^2$ (channel length and width of about 100 and about 165 μm, respectively). This dark bulk conductivity value is 2-3 orders of magnitude greater than previously reported for inkjet-printed MoS$_2$ films and 4 orders of magnitude greater than that of solution-processed MoS$_2$ films. This superior conductivity can be attributed to the densely percolating MoS$_2$ network, suitable contact interface between graphene and MoS$_2$ layers, and favorable carbonaceous EC residues for flake-flake contacts, which is consistent with the observations from graphene/EC films, as shown in FIG. 8.

Figure 3B:
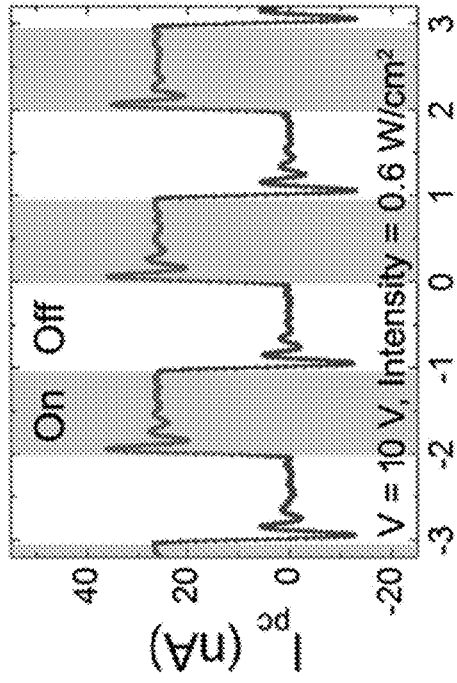
Figure 3C:
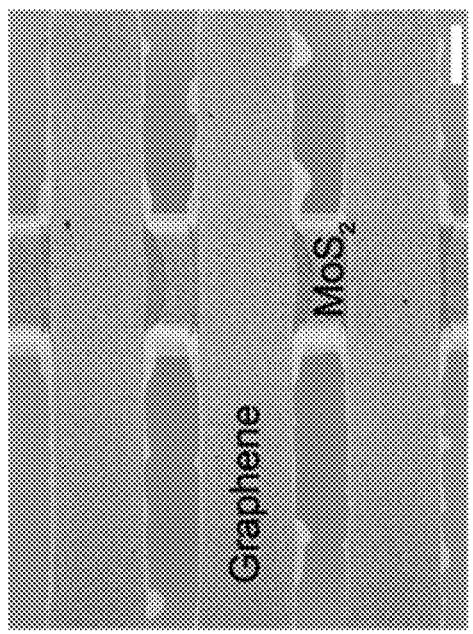
Figure 3D:
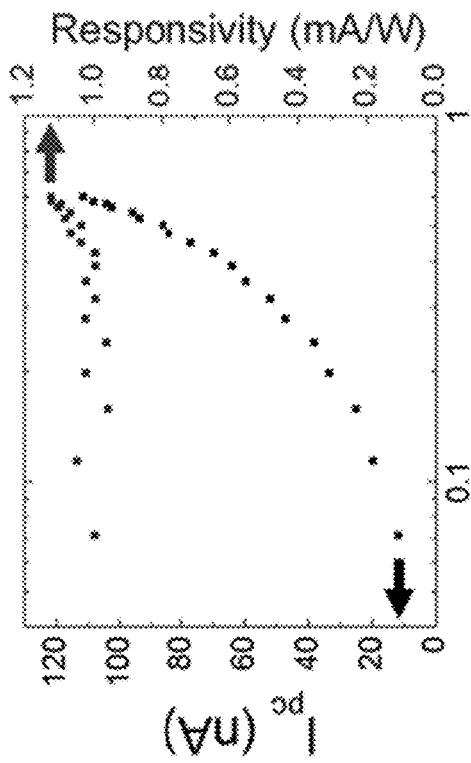
Figure 9B:
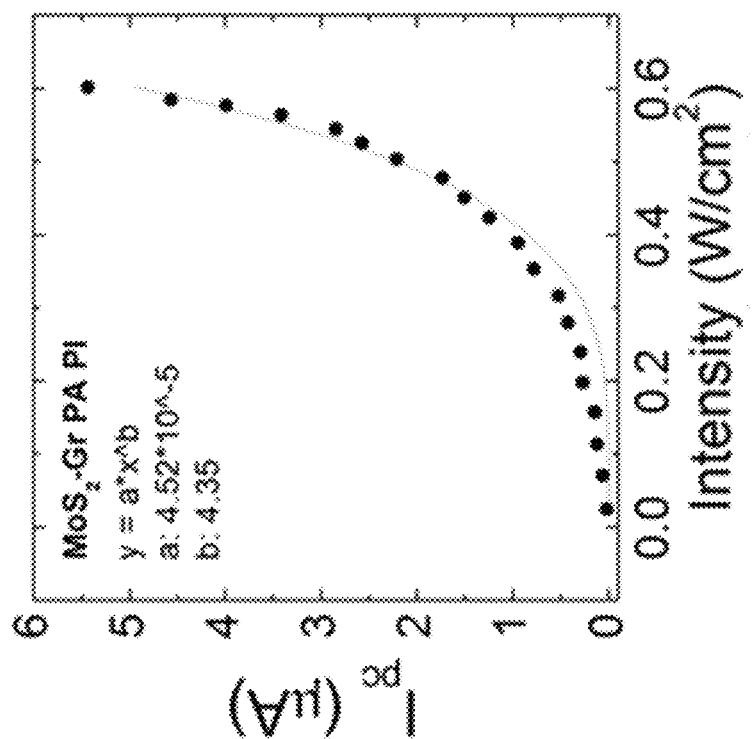
FIGS. 9A-9B show power-law fitting of photocurrent as a function of laser intensity for an $MoS_2$-Gr TA device and an $MoS_2$-Gr PA device, respectively, according to embodiments of the invention.
Figure 9A:
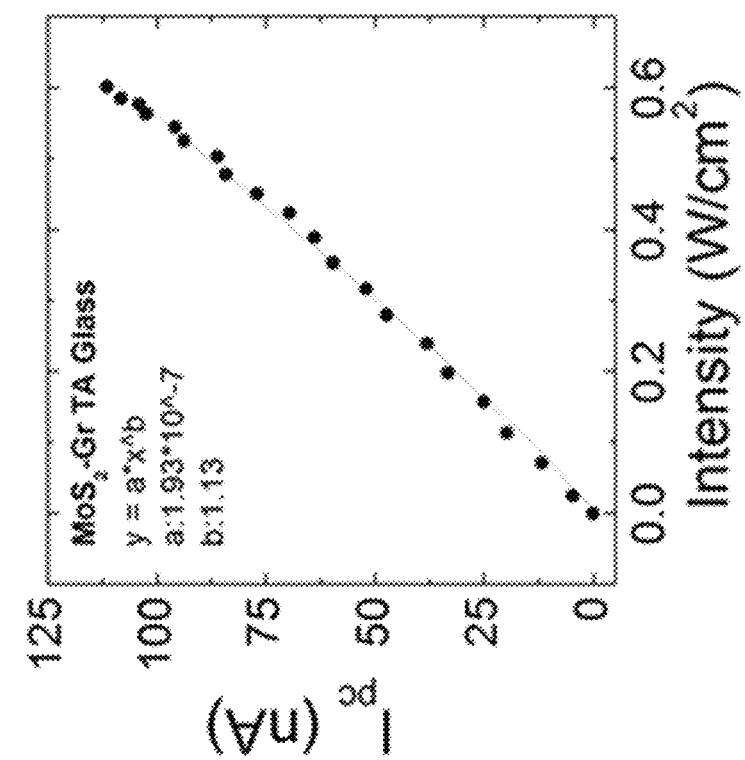
Figures 11A, 11B:
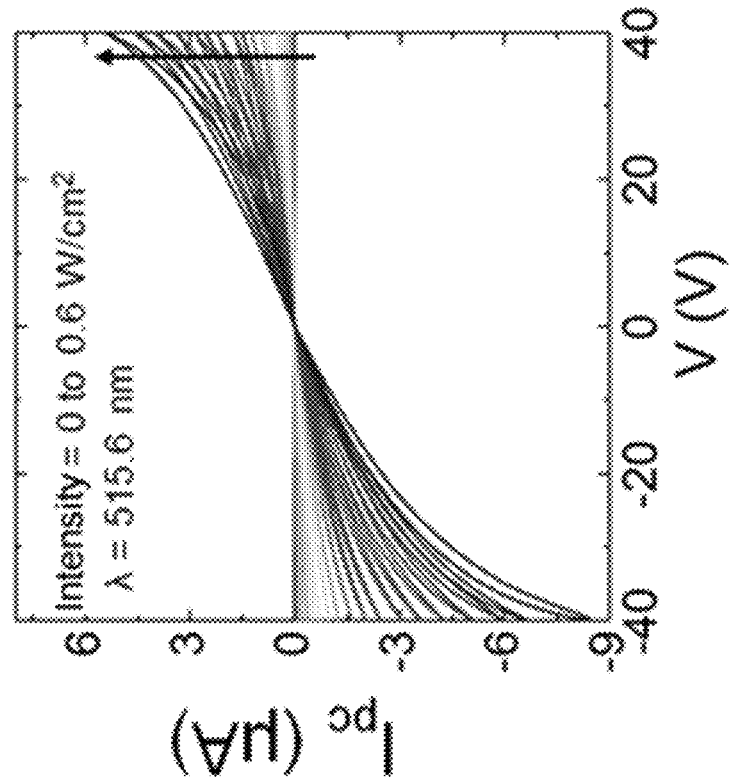
FIGS. 11A-11B show additional photocurrent data from the $MoS_2$-Gr PA device, according to embodiments of the invention.

Representative photoresponse data for the MoS$_2$-Gr TA device are shown in FIGS. 3B-3D, which was measured in vacuum with a power-tunable laser at λ=515.6 nm. The responsivity (R=I$_{pc}$/P$_{laser}$) of about 1 mA/W for the MoS$_2$-Gr TA photodetector is found to have a relatively weak dependence on the laser intensity, as shown in FIG. 3C. Previously, the dependence of responsivity on irradiation intensity in MoS$_2$ photodetectors has been explained by various photoconductivity models depending on the materials properties and device architecture. Generally, the responsivity exhibits a characteristic intensity dependence and temporal response that provides insight into the underlying photoexcitation and photoconduction mechanisms, including intrinsic band edge excitation and extrinsic effects from mid-gap trap states acting as recombination centers and/or sensitizers. The MoS$_2$-Gr TA device possesses a moderate power-law coefficient of about 1.13 from the intensity dependence of photocurrent, as shown in FIGS. 9A-9B, and a response time of less than 150 μs. The net effect is a weak power dependence of responsivity (R~P$^γ$, γ~0), which contrasts the sub-linear power dependence in monolayer CVD-grown MoS$_2$ phototransistors (γ<0) that has been attributed to bimolecular recombination, and the super-linear power dependence in previous solution-processed MoS$_2$ composite films (γ>0) that has been explained by a two-center Shockley-Read-Hall model. Super-linear power dependence can also arise from photothermal effects, although photothermal phenomena tend to show a slow time response. Therefore, the combination of a relatively weak power dependence and fast photoresponse suggests a balance between bimolecular and trap-mediated recombination in MoS$_2$-Gr TA photodetectors.

Figure 12B:
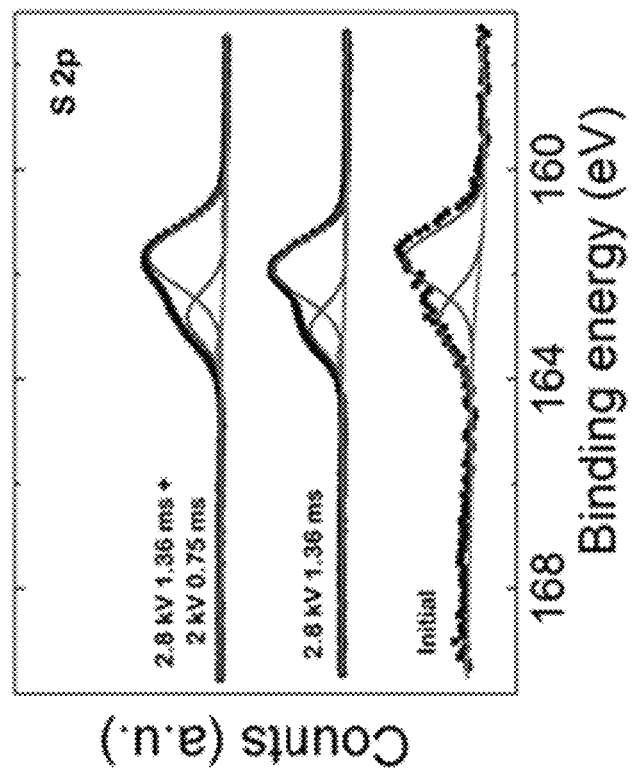
FIGS. 12A-12B show XPS analysis of an Mo 3d peak and an S 2p peak from a photonically annealed $MoS_2$ film, respectively, according to embodiments of the invention, showing the preservation of the stoichiometric nature of $MoS_2$ following the subsequent annealing condition used for the graphene electrode layer.
Figure 12A:
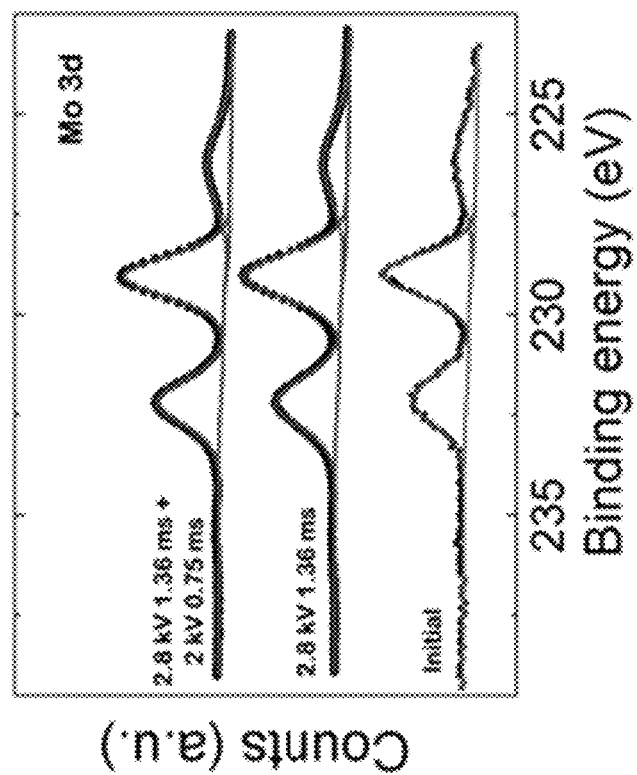

The versatility of inkjet-printed MoS$_2$/EC is further illustrated through the fabrication of fully printed photodetectors on flexible polyimide substrates using photonic annealing (MoS$_2$-Gr PA). While the device architecture is the same as MoS$_2$-Gr TA, as shown in FIG. 4A, the MoS$_2$/EC film in this case is first photonically annealed at about 2.8 kV for about 1.36 ms (about 4.06 J/cm$^2$), followed by inkjet printing of graphene electrodes and a milder second PA treatment at about 2 kV for about 0.75 ms (about 1.03 J/cm$^2$). Since graphene more efficiently absorbs light during photonic annealing than MoS$_2$, milder PA conditions were sufficient to remove EC from the printed graphene layers while avoiding oxidation of MoS$_2$ during the second PA treatment, as shown in FIGS. 12A-12B. The MoS$_2$-Gr PA photodetector characteristics were measured in vacuum (channel length and width of about 100 and about 180 μm, respectively), showing superlative dark bulk conductivity of about $1.07\times10^{-2}$ S/m, photocurrent close to about 5.5 μA, and responsivity exceeding about 50 mA/W at an irradiation intensity of about 0.6 W/cm$^2$. The increased dark bulk conductivity of MoS$_2$-Gr PA can likely be attributed to the improved contact interface between the intermixing surfaces of the photonically annealed MoS$_2$ and graphene layers. Previously, similar observations were noted in graphite-polymer composite films with carbon-based electrodes where increased surface intermixing led to lower contact resistance.

Figure 4F:
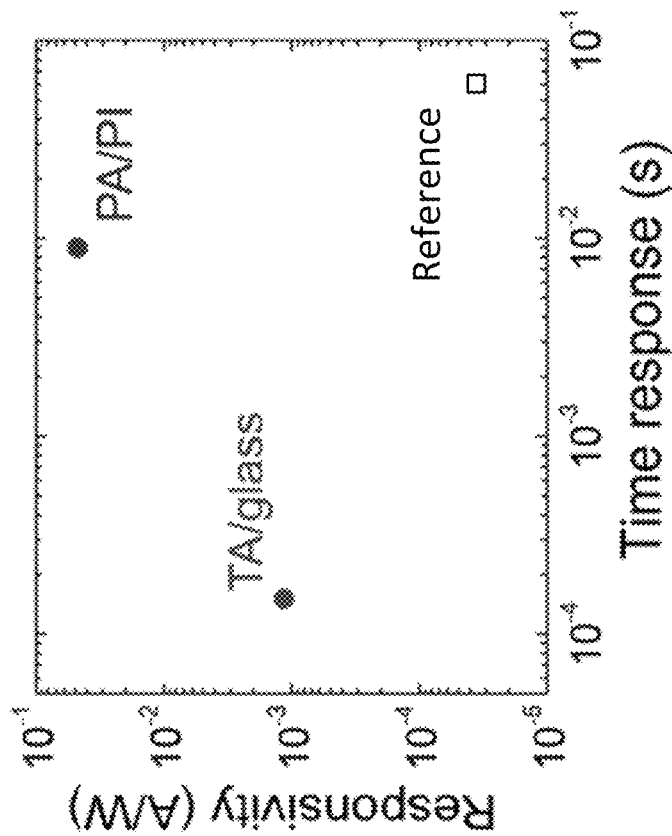
Figure 4E:
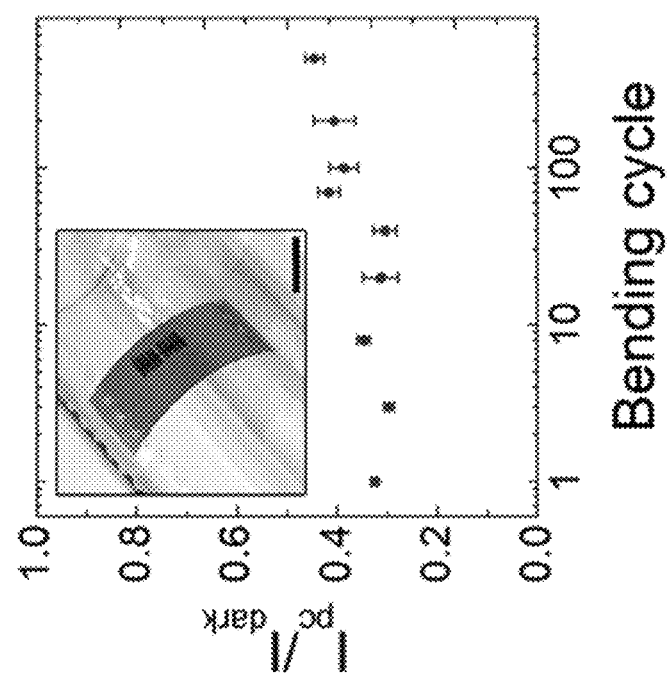

As shown in FIGS. 4B-4D, the photoresponse of MoS$_2$-Gr PA exhibits distinct behavior from the thermally annealed devices, particularly a super-linear intensity dependence for the photocurrent and a slower photoresponse time. Similar behavior has been previously reported for solution-processed composite MoS$_2$ films and CdS/CdSe heterostructures, and has been attributed to a two-center Shockley-Read-Hall model. However, the power-law fitting of photocurrent as function of laser power intensity for MoS$_2$-Gr PA leads to a coefficient greater than 2, as shown in FIGS. 9A-9B, which cannot be fully explained with the two-center Shockley-Read-Hall model. Therefore, it appears that there is also a contribution from photothermally generated charge carriers, which are expected to be more prominent for the MoS$_2$-Gr PA devices due to their increased porosity and correspondingly reduced thermal conductivity. Photothermal effects are also consistent with the increased photocurrent rise time for MoS$_2$-Gr PA (about 5 ms) compared to MoS$_2$-Gr TA (about 0.15 ms), as shown in FIG. 4D. Since the MoS$_2$-Gr PA photodetectors are fabricated on mechanically flexible polyimide substrates, their performance under bending is assessed in FIG. 4E, revealing invariant sensitivity (I$_{pc}$/I$_{dark}$) over about 500 bending cycles at a radius of curvature of about 8.1 mm. Lastly, in FIG. 4F, the distinctive photodetector metrics for both MoS$_2$-Gr TA and MoS$_2$-Gr PA are compared to previously reported inkjet-printed MoS$_2$ photodetectors. This comparative plot illustrates that both MoS$_2$-Gr TA and MoS$_2$-Gr PA have clear advantages compared to literature precedent with MoS$_2$-Gr TA providing more than 2 orders of magnitude faster time response and MoS$_2$-Gr PA providing about 1,000-fold higher responsivity.

In summary, an inkjet printable MoS$_2$ ink has been developed utilizing EC as a versatile binder that imparts tunability in viscosity and enhanced bulk conductivity following optimized thermal or photonic annealing. The inkjet-printed MoS$_2$/EC films are compatible with inkjet-printed graphene/EC electrodes, which enabled the fabrication of fully inkjet-printed photodetectors on rigid glass substrates following thermal annealing or flexible polyimide substrates following photonic annealing. Thermally annealing offers ultrafast photoresponse times under about 150 μs, whereas photonic annealing provides a mechanically flexible device with high responsivity over about 50 mA/W. Significantly, both figures of merit are orders of magnitude higher than previously reported inkjet-printed MoS$_2$ photodetectors. These results thus set a new standard for fully printed MoS$_2$ photodetectors with broad implications for optoelectronic applications that require high bandwidth and mechanical flexibility.

Among other things, the invention has at least the following advantages:

Most printable ink formulations for 2D semiconductor materials to date utilize harsh solvents (e.g., dimethylformamide and n-methyl-2-pyrrolidone) or water-based stabilizers (e.g., pyrene sulfonic acid derivatives), with limited control over viscosity. However, according the invention, the ethyl cellulose-based formulation leads to inks with a wide viscosity range, enabling diverse printing methods including spray coating, inkjet printing (about 5 mPa*s), and blade coating (about 500 mPa*s).

Solution-processed printed electronics typically require intensive annealing treatments above about 200° C. for about 30 minutes or longer. Oxidation-sensitive materials such as $MoS_2$ demand even more stringent processing conditions such as vacuum or inert gas flow, whereas the post-processing scheme according the invention utilizes photonic annealing, which reduces the treatment time down to the millisecond-scale and broadens the range of compatible substrates to include plastics.

Previously reported printed $MoS_2$ films show subpar electrical conductivity due to poor percolation and inter-flake contacts, whereas the films according the invention integrate the decomposed carbon residues of the polymeric stabilizer (ethyl cellulose) to enhance the inter-flake contacts and overall electrical conductivity.

Most commercial photodetectors require expensive materials (e.g., InGaAs, Ge, HgCdTe) and processes (e.g., cleanroom fabrication), whereas the devices according the invention use low-cost solution-processed materials with scalable printing methods.

The invention may have applications in a variety of fields, such as printable inks, optical communication devices, sensors, wearable devices, and so on.

These and other aspects of the invention are further described below. Without intent to limit the scope of the invention, exemplary instruments, apparatus, methods and their related results according to the embodiments of the invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Liquid-Phase Exfoliation and Processing of $MoS_2$ and Graphene

In this exemplary embodiment, $MoS_2$ was exfoliated from raw bulk powders (MilliporeSigma, <2 μm, 99%) using a high shear mixer (Silverson L5M-A) with a square hole high shear screen. Ethyl cellulose (EC) (MilliporeSigma, 4 cP grade as measured at 5% in 80:20 toluene:ethanol, 48% ethoxy) was dissolved in ethanol (Koptec, 200 proof) at a loading of 0.5% w/v, and raw $MoS_2$ was added at 10% w/v. This mixture was shear mixed for about 2 h at about 10230 rpm while submerged in an ice bath, and then centrifuged at about 3300 rpm (about 2000 g) for 30 min to sediment out large $MoS_2$ particles (Beckman Coulter Avanti J-26 XPI centrifuge). The supernatant containing $MoS_2$ nanosheets, EC, and ethanol was decanted and flocculated by mixing at a 5:3 weight ratio with an aqueous NaCl solution (about 0.04 g $mL^{-1}$ NaCl, MilliporeSigma, >99.5%) and centrifuging at about 7500 rpm (about 10000 g) for 6 min to obtain wet $MoS_2$/EC composite. This sediment was rinsed with deionized water, collected by vacuum filtration (Millipore Nitrocellulose HAWP 0.45 μm filter membrane), and then dried in air to yield the $MoS_2$/EC powder with a $MoS_2$ content of about 35-50 wt %. Graphene/EC powder was prepared as previously reported.

Ink Formulation and Preparation

In this exemplary embodiment, $MoS_2$/EC powder was dispersed in 85:15 v/v cyclohexanone:terpineol (MilliporeSigma) at loadings of 20-70 mg/mL using bath sonication. Graphene/EC ink compatible with inkjet printing and photonic annealing was prepared by dispersing graphene/EC powder (45% wt. graphene) in 80:15:5 v/v cyclohexanone:terpineol:diethylene glycol methyl ether (MilliporeSigma) at a loading of 30 mg/mL. Prior to inkjet printing, the $MoS_2$/EC and graphene/EC inks were filtered with 1.6 μm and 3.1 μm glass fiber syringe filters, respectively. The prepared inks were used over the course of one week to three months, with brief bath sonication (5-10 min) prior to use.

Inkjet Printing

In this exemplary embodiment, all inkjet printing used a Ceradrop X-Serie inkjet printer equipped with a 10 pL nominal drop size Dimatix cartridge (DMC-11610). A custom waveform profile was developed for the $MoS_2$/EC ink, and printing of $MoS_2$/EC and graphene/EC was performed with the inkjet nozzle plate maintained at 25° C. and 30° C., and the substrate held at 25° C. and 30° C., respectively. The glass substrates were purchased from Precision Glass and Optics (#1737, 0.7 mm thick), and the polyimide (PI) films were purchased from American Durafilm (DuPont Kapton FPC, 125 μm thick).

Thermal and Photonic Annealing

In this exemplary embodiment, thermal annealing was performed using a Lindberg/Blue M tube furnace (Thermo Scientific) at 400° C. for 3 hours under $Ar/H_2$ at a flow rate of 300 sccm. Photonic annealing was performed using a Xenon Sinteron 2000 with a spiral lamp configuration, with the sample held 25 mm from the lamp. For all photonic annealing treatments, a single light pulse was used with varying input voltage and time. The resulting light fluence is calculated based on manufacturer-provided data.

Materials Characterization

In this exemplary embodiment, the shear viscosity of the $MoS_2$/EC inks was measured with an Anton Paar Physica MCR 302 rheometer equipped with a Peltier plate and 25 mm, 2° cone and plate geometry, at shear rates of 1-1000 $s^{-1}$. The optical microscopy images were obtained with an Olympus optical microscope, the height profiles using a Dektak 150 Stylus Surface Profiler, atomic force microscopy (AFM) images using an Asylum Cypher AFM in tapping mode, and scanning electron microscopy (SEM) images using a Hitachi SU8030 system. X-ray photoelectron spectroscopy (XPS) was performed with a Thermo Scientific ESCALAB 250Xi equipped with a monochromatic KR Al X-ray source. A flood gun was used for charge compensation, and the spectra were analyzed using Avantage (Thermo Scientific) software.

Electrical and Photocurrent Measurements

In this exemplary embodiment, all electrical and photodetector measurements of the inkjet-printed graphene-$MoS_2$ photodetectors were carried out in vacuum (pressure $5 \times 10^{-5}$ torr) using a probe station (LakeShore CRX 4K). The device was illuminated by a laser source with wavelength of 515.6 nm (LP520MF100, Thor Labs) that was coupled to the probe station by a multi-mode fiber optical cable. Laser power was varied by controlling the laser diode current while the operating temperature was fixed at 25° C. (ITC4001, Thor Labs). Laser power was calibrated with a Si photodiode (S120C, Thor Labs) coupled with an energy meter (PM100D, Thor Labs). Time-resolved measurements were carried out by generating laser pulses with an electronic chopper while the drain current signal was captured by a preamplifier and a digital oscilloscope.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

Some references, which may include patents, patent applications and various publications, are cited and discussed in the description of this invention. The citation and/or discussion of such references is provided merely to clarify the description of the invention and is not an admission that any such reference is "prior art" to the invention described herein. All references cited and discussed in this specification are incorporated herein by reference in their entireties and to the same extent as if each reference was individually incorporated by reference.

LIST OF REFERENCES

[1]. Novoselov, K. S.; Mishchenko, A.; Carvalho, A.; Castro Neto, A. H. *Science* 2016, 353, aac9439.
[2]. Jariwala, D.; Sangwan, V. K.; Lauhon, L. J.; Marks, T. J.; Hersam, M. C. *ACS Nano* 2014, 8, 1102-1120.
[3]. Sangwan, V. K.; Hersam, M. C. *Annu. Rev. Phys. Chem.* 2018, 69, 299-325.
[4]. Britnell, L.; Ribeiro, R. M.; Eckmann, A.; Jalil, R.; Belle, B. D.; Mishchenko, A.; Kim, Y. J.; Gorbachev, R. V.; Georgiou, T.; Morozov, S. V.; Grigorenko, A. N.; Geim, A. K.; Casiraghi, C.; Neto, A. H. C.; Novoselov, K. S. *Science* 2013, 340, 1311-1314.
[5]. Roy, K.; Padmanabhan, M.; Goswami, S.; Sai, T. P.; Ramalingam, G.; Raghavan, S.; Ghosh, A. Nat. *Nanotech.* 2013, 8, 826-830.
[6]. De Fazio, D.; Goykhman, I.; Yoon, D.; Bruna, M.; Eiden, A.; Milana, S.; Sassi, U.; Barbone, M.; Dumcenco, D.; Marinov, K.; Kis, A.; Ferrari, A. C. *ACS Nano* 2016, 10, 8252-8262.
[7]. Withers, F.; Del Pozo-Zamudio, O.; Mishchenko, A.; Rooney, A. P.; Gholinia, A.; Watanabe, K.; Taniguchi, T.; Haigh, S. J.; Geim, A. K.; Tartakovskii, A. I.; Novoselov, K. S. *Nat. Mater.* 2015, 14, 301-306.
[8]. Britnell, L.; Gorbachev, R. V.; Jalil, R.; Belle, B. D.; Schedin, F.; Mishchenko, A.; Georgiou, T.; Katsnelson, M. I.; Eaves, L.; Morozov, S. V.; Peres, N. M. R.; Leist, J.; Geim, A. K.; Novoselov, K. S.; Ponomarenko, L. A. *Science* 2012, 335, 947-950.
[9]. Yu, L.; Lee, Y. H.; Ling, X.; Santos, E. J. G.; Shin, Y. C.; Lin, Y.; Dubey, M.; Kaxiras, E.; Kong, J.; Wang, H.; Palacios, T. *Nano Lett.* 2014, 14, 3055-3063.
[10]. Behranginia, A.; Yasaei, P.; Majee, A. K.; Sangwan, V. K.; Long, F.; Foss, C. J.; Foroozan, T.; Fuladi, S.; Hantehzadeh, M. R.; Shahbazian-Yassar, R.; Hersam, M. C.; Aksamija, Z.; Salehi-Khojin, A. *Small* 2017, 13, 1604301.
[11]. Wang, F.; Wang, Z.; Xu, K.; Wang, F.; Wang, Q.; Huang, Y.; Yin, L.; He, *J. Nano Lett.* 2015, 15, 7558-7566.
[12]. Cheng, R.; Li, D.; Zhou, H.; Wang, C.; Yin, A.; Jiang, S.; Liu, Y.; Chen, Y.; Huang, Y.; Duan, X. *Nano Lett.* 2014, 14, 5590-5597.
[13]. Deng, Y.; Luo, Z.; Conrad, N. J.; Liu, H.; Gong, Y.; Najmaei, S.; Ajayan, P. M.; Lou, J.; Xu, X.; Ye, P. D. *ACS Nano* 2014, 8, 8292-8299.
[14]. Coleman, J. N.; Lotya, M.; O'Neill, A.; Bergin, S. D.; King, P. J.; Khan, U.; Young, K.; Gaucher, A.; De, S.; Smith, R. J.; Shvets, I V.; Arora, S. K.; Stanton, G.; Kim, H. Y.; Lee, K.; Kim, G. T.; Duesberg, G. S.; Hallam, T.; Boland, J. J.; Wang, J. J.; Donegan, J. F.; Grunlan, J. C.; Moriarty, G.; Shmeliov, A.; Nicholls, R. J.; Perkins, J. M.; Grieveson, E. M.; Theuwissen, K.; McComb, D. W.; Nellist, P. D.; Nicolosi, V. *Science* 2011, 331, 568-571.
[15]. Kang, J.; Sangwan, V. K.; Wood, J. D.; Hersam, M. C. *Acc. Chem. Res.* 2017, 50, 943-951.
[16]. Backes, C.; Szydlowska, B. M.; Harvey, A.; Yuan, S.; Vega-Mayoral, V.; Davies, B. R.; Zhao, P.-l.; Hanlon, D.; Santos, E. J. G.; Katsnelson, M. I.; Blau, W. J.; Gadermaier, C.; Coleman, J. N. *ACS Nano* 2016, 10, 1589-1601.
[17]. Secor, E. B.; Hersam, M. C. *J. Phys. Chem.* Lett. 2015, 6, 620-626.
[18]. Zhu, J.; Kang, J.; Kang, J.; Jariwala, D.; Wood, J. D.; Seo, J. W. T.; Chen, K. S.; Marks, T. J.; Hersam, M. C. *Nano Lett.* 2015, 15, 7029-7036.
[19]. Kang, J.; Wood, J. D.; Wells, S. A.; Lee, J. H.; Liu, X.; Chen, K. S.; Hersam, M. C. *ACS Nano* 2015, 9, 3596-3604.
[20]. Seo, J. W. T.; Green, A. A.; Antaris, A. L.; Hersam, M. C. *J. Phys. Chem. Lett.* 2011, 2, 1004-1008.
[21]. Hu, G.; Kang, J.; Ng, L. W. T.; Zhu, X.; Howe, R. C. T.; Jones, C. G.; Hersam, M. C.; Hasan, T. *Chem. Soc. Rev.* 2018, 47, 3265-3300.
[22]. Kelly, A. G.; Hallam, T.; Backes, C.; Harvey, A.; Esmaeily, A. S.; Godwin, I.; Coelho, J.; Nicolosi, V.; Lauth, J.; Kulkarni, A.; Kinge, S.; Siebbeles, L. D. A.; Duesberg, G. S.; Coleman, J. N. *Science* 2017, 356, 69-73.
[23]. McManus, D.; Vranic, S.; Withers, F.; Sanchez-Romaguera, V.; Macucci, M.; Yang, H.; Sorrentino, R.; Parvez, K.; Son, S. K.; Iannaccone, G.; Kostarelos, K.; Fiori, G.; Casiraghi, C. *Nat. Nanotech.* 2017, 12, 343-350.
[24]. Finn, D. J.; Lotya, M.; Cunningham, G.; Smith, R. J.; McCloskey, D.; Donegan, J. F.; Coleman, J. N. *J. Mater. Chem. C* 2014, 2, 925-932.
[25]. Li, J.; Naiini, M. M.; Vaziri, S.; Lemme, M. C.; Östling, M. *Adv. Funct. Mater.* 2014, 24, 6524-6531.
[26]. Secor, E. B.; Ahn, B. Y.; Gao, T. Z.; Lewis, J. A.; Hersam, M. C. *Adv. Mater.* 2015, 27, 6683-6688.
[27]. Sadeghi, R. *J. Chem. Thermodyn.* 2005, 37, 445-448.
[28]. Kamyshny, A.; Magdassi, S. *Small* 2014, 10, 3515-3535.
[29]. Sim, D. M.; Kim, M.; Yim, S.; Choi, M. J.; Choi, J.; Yoo, S.; Jung, Y. S. *ACS Nano* 2015, 9, 12115-12123.
[30]. Arapov, K.; Bex, G.; Hendriks, R.; Rubingh, E.; Abbel, R.; de With, G.; Friedrich, H. *Adv. Eng. Mater.* 2016, 18, 1234-1239.
[31]. Secor, E. B.; Gao, T. Z.; Dos Santos, M. H.; Wallace, S. G.; Putz, K. W.; Hersam, M. C. *ACS Appl. Mater. Interfaces* 2017, 9, 29418-29423.

[32]. Inzani, K.; Nematollahi, M.; Vullum-Bruer, F.; Grande, T.; Reenaas, T. W.; Selbach, S. M. *Phys. Chem. Chem. Phys.* 2017, 19, 9232-9245.
[33]. Guo, Y.; Robertson, J. *Appl. Phys. Lett.* 2014, 105, 222110.
[34]. López-Carreño, L. D.; Pardo, A.; Zuluaga, M.; Cortés-Bracho, O. L.; Torres, J.; Alfonso, J. E. *Phys. Status solidi C* 2007, 4, 4064-4069.
[35]. Eda, G.; Yamaguchi, H.; Voiry, D.; Fujita, T.; Chen, M.; Chhowalla, M. *Nano Lett.* 2011, 11, 5111-5116.
[36]. Xuan, W.; Yong Ping, Z.; Zhi Qian, C. *Mater. Res. Express* 2016, 3, 065014.
[37]. Spevack, P. A.; McIntyre, N. S. *J. Phys. Chem.* 1993, 97, 11031-11036.
[38]. Cunningham, G.; Lotya, M.; McEvoy, N.; Duesberg, G. S.; van der Schoot, P.; Coleman, J. N. *Nanoscale* 2012, 4, 6260-6264.
[39]. Furchi, M. M.; Polyushkin, D. K.; Pospischil, A.; Mueller, T. *Nano Lett.* 2014, 14, 6165-6170.
[40]. Lopez-Sanchez, O.; Lembke, D.; Kayci, M.; Radenovic, A.; Kis, A. *Nat. Nanotech.* 2013, 8, 497-501.
[41]. Kufer, D.; Konstantatos, G. *Nano Lett.* 2015, 15, 7307-7313.
[42]. Bube, R. H. *Phys. Rev.* 1955, 99, 1105-1116.
[43]. Avasarala, B.; Haldar, P. *J. Power Sources* 2009, 188, 225-229.
[44]. Shockley, W.; Read, W. T. *Phys. Rev.* 1952, 87, 835-842.
[45]. Hall, R. N. *Phys. Rev.* 1951, 83, 228-228.
[46]. Xia, F.; Mueller, T.; Lin, Y. m.; Valdes-Garcia, A.; Avouris, P. *Nat. Nanotech.* 2009, 4, 839-843.
[47]. Akinwande, D.; Petrone, N.; Hone, J. *Nat. Commun.* 2014, 5, 5678.

What is claimed is:

1. A printable optoelectronic ink, comprising:
   at least one two-dimensional (2D) semiconductor; and
   a binder mixing with the at least one 2D semiconductor in a solvent system,
   wherein viscosity of the printable optoelectronic ink is tunable and optimizable by dispersing a mixture of the at least one 2D semiconductor and the binder in the solvent system at different loadings; and
   wherein the printable optoelectronic ink is formed to possess a super-linear dependence of the viscosity on mass loading and reduced viscosities at elevated temperatures.

2. The printable optoelectronic ink of claim 1, wherein the at least one 2D semiconductor comprises nanoparticles comprising nanosheets, nanoflakes, nanofibers, nanotubes, or combinations of them.

3. The printable optoelectronic ink of claim 2, wherein the at least one 2D semiconductor comprises $MoS_2$, $WS_2$, $ReS_2$, InSe, GaTe, or black phosphorus (BP).

4. The printable optoelectronic ink of claim 2, being formed such that a film is formable to have percolating networks by a single printing pass, or multiple printing passes of the printable optoelectronic ink.

5. The printable optoelectronic ink of claim 4, wherein the binder comprises a polymer stabilizer adapted to achieve high loading and uniform dispersion of the at least one 2D semiconductor in the solvent system.

6. The printable optoelectronic ink of claim 4, wherein the binder is adapted such that annealing of the film results in decomposition of the binder, thereby forming a percolating film in which electrical contact between the nanoparticles is enhanced.

7. The printable optoelectronic ink of claim 6, wherein the binder comprises ethyl cellulose (EC), nitrocellulose, cellulose sulfate, methyl cellulose, ethyl methyl cellulose, hydroxyethyl cellulose, hydroxypropyl cellulose, hydoxyethyl methyl cellulose, or carboxymethyl cellulose.

8. The printable optoelectronic ink of claim 1, wherein the solvent system is a dual solvent system containing cyclohexanone and terpineol.

9. The printable optoelectronic ink of claim 1, being applicable for inkjet printing, spray coating, screen printing, and/or blade coating.

* * * * *